(12) United States Patent
Liu

(10) Patent No.: US 6,856,533 B2
(45) Date of Patent: Feb. 15, 2005

(54) METHOD OF MODULATING THRESHOLD VOLTAGE OF A MASK ROM

(75) Inventor: Kuang-Wen Liu, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 96 days.

(21) Appl. No.: 10/417,105

(22) Filed: Apr. 17, 2003

(65) Prior Publication Data

US 2004/0208040 A1 Oct. 21, 2004

(51) Int. Cl.⁷ .............................................. G01C 17/00
(52) U.S. Cl. ...................................... 365/104; 365/102
(58) Field of Search .................................. 365/104, 102

(56) References Cited

U.S. PATENT DOCUMENTS 5,892,714 A * 4/1999 Choi ...................... 365/185.22

* cited by examiner

Primary Examiner—Michael S. Lebentritt
Assistant Examiner—Pho M. Luu
(74) Attorney, Agent, or Firm—Shaw Pittman LLP

(57) ABSTRACT

A method of modulating a threshold voltage of a mask read-only memory, including providing a substrate, providing a source region in the substrate, providing a drain region in the substrate, defining a channel region between the source and drain regions, providing a gate dielectric layer over the substrate, the source region, the drain region and the channel region, providing a gate over the gate dielectric layer, and providing a parasitic capacitor between the gate and the substrate to modulate the threshold voltage of the mask read-only memory, wherein the threshold voltage is inversely proportional to a value of the parasitic capacitor.

19 Claims, 2 Drawing Sheets

US 6,856,533 B2

METHOD OF MODULATING THRESHOLD VOLTAGE OF A MASK ROM

RELATED APPLICATION

This application is related to U.S. application Ser. No. 10/387,488, filed on Mar. 14, 2003, entitled "Method of Forming an Embedded ROM." This related application is expressly incorporated herein by reference.

DESCRIPTION OF THE INVENTION

1. Field of the Invention

This invention relates to a mask read-only memory (ROM), and more particularly, to a method of modulating the threshold voltage of a mask ROM.

2. Background of the Invention

A read-only memory (ROM) is a type of non-volatile memory that retains stored data even when no power is provided to the ROM. A mask ROM is also a type of ROM, and its memory cells are programmed by selectively implanting impurity ions into the channel region of a cell transistor during the manufacturing process. The data are loaded into the mask ROM cells. This is known as "programming" or "coding," and the data are "coded" into the mask that is used to form the ROM. A characteristic of a mask ROM is that after programming, the stored data cannot be altered.

A conventional manufacturing process of a mask ROM first forms the memory cells, e.g., MOS transistors, within each mask ROM product. In general, the source and drain regions, which serve as bit lines, of the cell transistors are formed in the semiconductor substrate. An ion implantation of impurities into the channel regions of the transistors follows using a patterned mask to adjust the threshold voltage of various transistors, thereby "coding" the ROM. This step of the manufacturing process is also known as "code" implantation. Selected and ion implanted transistors will have different threshold voltages from the non-selected transistors to differentiate between the logic data of "1" and "0" Word lines, or gates, connecting the transistors are then formed.

If the semiconductor device upon which the mask ROM is formed includes other devices, such as logic circuits, then these other devices are separately formed.

SUMMARY OF THE INVENTION

In accordance with the present invention, there is provided a method of modulating a threshold voltage of a mask read-only memory that includes providing a substrate, providing a source region in the substrate, providing a drain region in the substrate, defining a channel region between the source and drain regions, providing a gate dielectric layer over the substrate, the source region, the drain region and the channel region, providing a gate over the gate dielectric layer, and providing a parasitic capacitor between the gate and the substrate to modulate the threshold voltage of the mask read-only memory, wherein the threshold voltage is inversely proportional to a value of the parasitic capacitor.

Also in accordance with the present invention, there is provided a method of modulating a threshold voltage of a mask read-only memory that includes providing a substrate, providing a source region in the substrate, providing a drain region in the substrate, defining a channel region between the source and drain regions, providing a gate dielectric layer over the substrate, the source region, the drain region and the channel region, and providing a gate having a gate depletion effect to module the threshold voltage.

Still in accordance with the present invention, there is provided a method of forming a mask read-only memory that includes providing a semiconductor substrate, forming a plurality of bit lines in the substrate, forming a gate insulation layer over the substrate, forming a plurality of polysilicon layers over the gate insulation layer, and implanting impurity ions into at least one predetermined portion of the plurality of polysilicon layers to modulate a threshold voltage of a memory cell.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention.

In the drawings.

DESCRIPTION OF THE EMBODIMENTS

Reference will now be made in detail to the preferred embodiments of the invention, examples of which are illustrated in the accompanying drawings. Wherever possible, the same reference numbers will be used throughout the drawings to refer to the same or like parts.

The method of the present invention modulates the threshold voltage of a memory cell of a mask ROM through ion implantation of the gate. In addition, through non-uniform ion implantation of the gate, a depletion effect is created to further modulate the threshold voltage of the memory cell. The non-uniform ion implantation creates a parasitic capacitor coupled in series between the doped region of the gate and the semiconductor substrate. The threshold voltage of the memory cell is therefore inversely proportional to the value of the series capacitor, thereby permitting the modulation of the threshold voltage through gate depletion effect.

Figure 1:
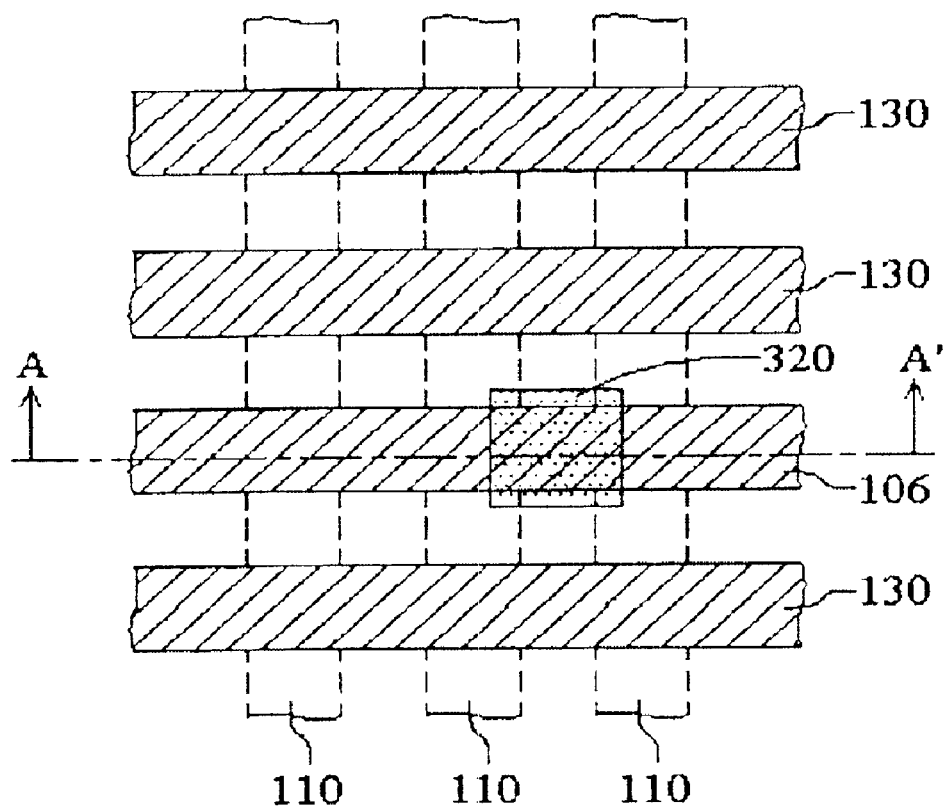
FIG. 1 is a layout of a mask ROM device fabricated in accordance with one embodiment of the present invention.

FIG. 1 is a layout of a memory array of a mask ROM device fabricated in accordance with one embodiment of the present invention. Referring to FIG. 1, the memory array (not numbered) includes a substrate (now shown in FIG. 1), a plurality of substantially parallel bit lines 110, and a plurality of substantially parallel word lines 130, each being substantially perpendicular to each of bit lines 110.

Figure 2:
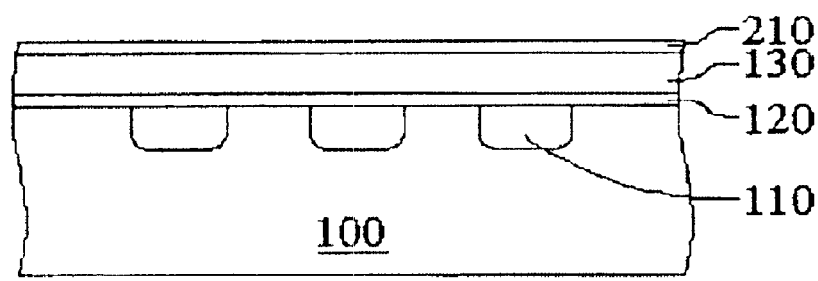
FIGS. 2–4 are cross-sectional views of the manufacturing process of the mask ROM shown in FIG. 1 taken along the A-A' direction consistent with one embodiment of the present invention.
Figure 3:
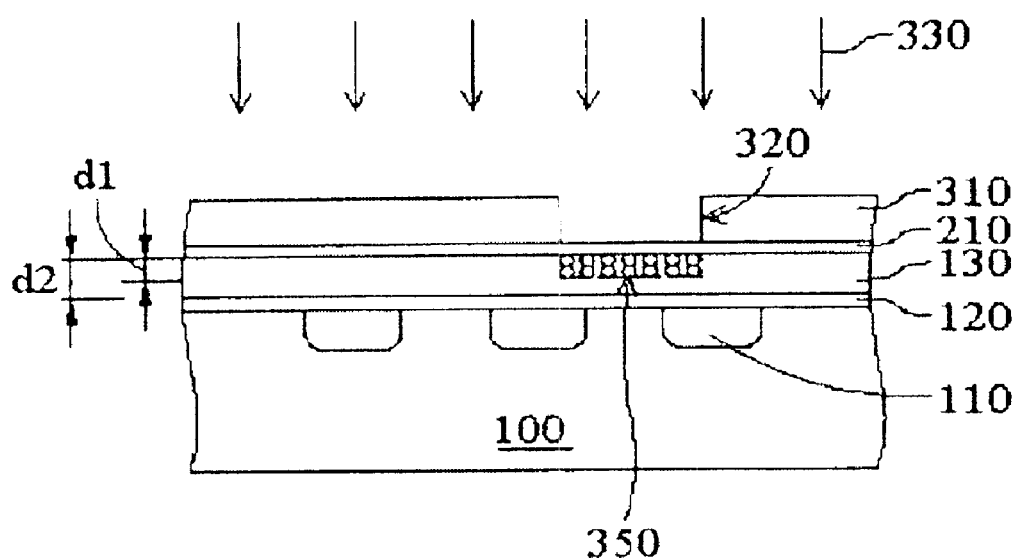
Figure 4:
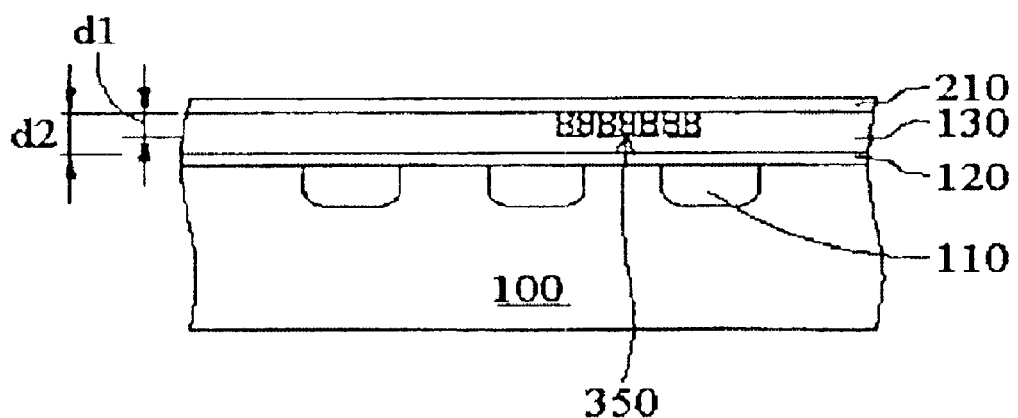

FIGS. 2–4 are cross-sectional views of the manufacturing process of the mask ROM shown in FIG. 1 taken along the A-A' direction consistent with one embodiment of the present invention. Referring to FIG. 2, a semiconductor substrate 100, such as a silicon wafer, is provided. Bit lines 110, or diffused regions that serve as source/drain regions of MOS transistors, are formed in substrate 100 through conventional manufacturing process. Each pair of bit lines 110 defines a channel region (not numbered) therebetween. The channel region may be simultaneously implanted with impurity ions to render the channel region conductive.

A gate insulation layer 120 is formed over substrate 100 and bit lines 110. Gate insulation layer 120 may comprise any oxide material, for example, $SiO_2$, provided through any conventional thermal oxidation or deposition process. A layer of polysilicon 130 is then deposited over gate insulation layer 120. Polysilicon layer 130 is then patterned and etched form a plurality of gates, or word lines. Polysilicon layer 130 may be deposited through chemical-vapor deposition (CVD). A conductive layer 210, such as a tungsten salicide layer made by standard logic process, may be used to improve the conductivity of the word lines.

Referring to FIG. 3, a photoresist layer 310 is coated on conductive layer 210. Photoresist layer 310 is then defined and patterned to form coding openings 320. As shown in FIG. 1, each coding opening 320 may be a square-shaped opening that exposes a portion of a surface area of polysilicon layer 130, or gates/word lines.

Referring to FIG. 3 again, impurity ions, either n-type or p-type, are then implanted into exposed areas of polysilicon layer 130 through coding openings 320 to form at least one doped region 350. Polysilicon layer 130 has a thickness d2. Doped region 350 has a depth d1 in polysilicon layer 130. In one embodiment, polysilicon layer 130 thickness d2 is greater than depth d1 of doped region 350. In other words, part of polysilicon layer 130 is undoped. Referring to FIG. 4, photoresist layer 310 is removed, by either wet etching or dry etching.

In operation, a parasitic capacitance (not shown) is formed between doped region 350 and substrate 100. Therefore, the capacitance of the parasitic capacitance depends on the concentration of the implanted impurity ions and the thickness of doped region 350. Since a threshold voltage of the MOS transistors is inversely proportional to the series capacitance, by changing the conditions of the ion implantation such as power and/or dosage, thereby changing the impurity concentration and implantation depth d1 of the impurity ions, the threshold voltage of a memory cell may be changed.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of modulating a threshold voltage of a mask read-only memory, comprising:

providing a substrate;

providing a source region in the substrate;

providing a drain region in the substrate;

defining a channel region between the source and drain regions;

providing a gate dielectric layer over the substrate, the source region, the drain region and the channel region;

providing a gate over the gate dielectric layer; and providing a parasitic capacitor between the gate and the substrate to modulate the threshold voltage of the mask read-only memory, wherein the threshold voltage is inversely proportional to a value of the parasitic capacitor.

2. The method as claimed in claim 1, wherein the step of providing a parasitic capacitor includes doping the gate with impurity ions.

3. The method as claimed in claim 1, wherein the step of providing a parasitic capacitor includes providing the parasitic capacitor in series.

4. The method as claimed in claim 1, further comprising forming a conductive layer on the gate.

5. A method of modulating a threshold voltage of a mask read-only memory, comprising:

providing a substrate;

providing a source region in the substrate;

providing a drain region in the substrate;

defining a channel region between the source and drain regions;

providing a gate dielectric layer over the substrate, the source region, the drain region and the channel region; and providing a gate having a gate depletion effect to module the threshold voltage.

6. The method as claimed in claim 5, wherein the step of providing a gate includes providing a parasitic capacitor between the gate and the substrate, wherein the threshold voltage is inversely proportional to a value of the parasitic capacitor.

7. The method as claimed in claim 6, wherein the step of providing a parasitic capacitor includes doping the gate with impurity ions.

8. The method as claimed in claim 5, further comprising forming a conductive layer on the gate.

9. A method of forming a mask read-only memory, comprising: providing a semiconductor substrate;

forming a plurality of bit lines in the substrate;

forming a gate insulation layer over the substrate;

forming a plurality of polysilicon layers over the gate insulation layer; and implanting impurity ions into at least one predetermined portion of the plurality of polysilicon layers to modulate a threshold voltage of a memory cell.

10. The method as claimed in claim 9, wherein forming a gate insulation layer comprises providing a $SiO_2$ layer through thermal oxidation.

11. The method as claimed in claim 9, wherein forming a gate insulation layer comprises providing a $SiO_2$ layer through deposition.

12. The method as claimed in claim 9, wherein implanting impurity ions into at least one predetermined portion of the plurality of polysilicon layers comprises implanting the impurity ions into at least one of the plurality of polysilicon layers to form a doped region in the at least one polysilicon layer having a depth, and the at least one polysilicon layer having a thickness, and wherein the thickness is greater than the depth.

13. The method as claimed in claim 9, wherein implanting impurity ions into at least one predetermined portion of the plurality of polysilicon layers creates a gate depletion effect.

14. The method as claimed in claim 9, wherein implanting impurity ions into at least one predetermined portion of the plurality of polysilicon layers comprises providing a parasitic capacitor between at least one of the plurality of polysilicon layers gate and the substrate to modulate the threshold voltage.

15. The method as claimed in claim 14, wherein the threshold voltage is inversely proportional to a value of the parasitic capacitor.

16. The method as claimed in claim 14, wherein the parasitic capacitor is provided in series.

17. The method as claimed in claim 9, wherein the impurity ions are n-type impurity ions.

18. The method as claimed in claim 9, further comprising forming a conductive layer on the plurality of polysilicon layers.

19. The method according to claim 18, wherein the conductive layer comprises $WSi_x$.

* * * * *